US011855481B2

(12) United States Patent
Kim et al.

(10) Patent No.: US 11,855,481 B2
(45) Date of Patent: Dec. 26, 2023

(54) ELECTRONIC DEVICE INCLUDING POWER MANAGEMENT INTEGRATED CIRCUIT AND OPERATING METHOD THEREOF

(71) Applicant: Samsung Electronics Co., Ltd., Gyeonggi-do (KR)

(72) Inventors: Jungjoon Kim, Gyeonggi-do (KR); Dohun Kim, Gyeonggi-do (KR); Heecheol Ahn, Gyeonggi-do (KR); Yeonsang Yun, Gyeonggi-do (KR); Kyujae Jang, Gyeonggi-do (KR); Minkwon Jeong, Gyeonggi-do (KR)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 17/939,586

(22) Filed: Sep. 7, 2022

(65) Prior Publication Data

US 2023/0080762 A1 Mar. 16, 2023

(30) Foreign Application Priority Data

Sep. 16, 2021 (KR) ........................ 10-2021-0124081

(51) Int. Cl.
*H02J 7/34* (2006.01)
*H02J 7/00* (2006.01)
*H03F 3/21* (2006.01)
*H03F 1/02* (2006.01)

(52) U.S. Cl.
CPC .......... *H02J 7/345* (2013.01); *H02J 7/00032* (2020.01); *H03F 1/0216* (2013.01); *H03F 3/21* (2013.01); *H02J 2207/20* (2020.01); *H02J 2207/50* (2020.01); *H03F 2200/105* (2013.01)

(58) Field of Classification Search
CPC .... H02J 7/345; H02J 7/00032; H02J 2207/20; H02J 2207/50; H03F 1/0216; H03F 3/21; H03F 2200/105
See application file for complete search history.

(56) References Cited

U.S. PATENT DOCUMENTS

| | | |
|---|---|---|
| 9,099,076 B2 | 8/2015 | Christoph et al. |
| 9,672,986 B2 | 6/2017 | Koller et al. |
| 9,734,814 B2 | 8/2017 | Christoph et al. |
| 10,056,066 B2 | 8/2018 | Christoph et al. |
| 10,179,254 B2 | 1/2019 | Martinez et al. |
| 10,188,884 B2 | 1/2019 | Guardiano et al. |
| 10,525,295 B2 | 1/2020 | Guardiano et al. |
| 10,886,953 B2 * | 1/2021 | Feng ........................ H03F 3/72 |

* cited by examiner

*Primary Examiner* — Carlos Amaya
(74) *Attorney, Agent, or Firm* — The Farrell Law Firm, P.C.

(57) ABSTRACT

An electronic device includes a battery, a plurality of capacitors, a converter that receives power from the battery and charges each of the plurality of capacitors to different voltages based on the power, a plurality of switches that switch a first path and a second path of each of the plurality of capacitors, and a controller. The controller selects a first switch among the plurality of switches based on a received signal, and controls the first switch such that a path of a capacitor connected to the first switch is switched from the first path to the second path, and the first path is a path which electrically connects each of the plurality of capacitors to the converter, the second path is a path which electrically connects each of the plurality of capacitors and a power amplifier (PA).

20 Claims, 7 Drawing Sheets

ELECTRONIC DEVICE INCLUDING POWER MANAGEMENT INTEGRATED CIRCUIT AND OPERATING METHOD THEREOF

CROSS-REFERENCE TO RELATED APPLICATION(S)

This application claims priority to Korean Patent Application No. 10-2021-0124081, which was filed on Sep. 16, 2021, in the Korean Intellectual Property Office, the entire contents of which is incorporated herein by reference.

BACKGROUND

1. Field

The disclosure relates generally to an electronic device including a power management integrated circuit (PMIC) and a method of operating the same.

2. Description of Related Art

A mobile terminal may support various communications (e.g., cellular communications such as a long-term evolution (LTE) and/or a new radio (NR)). The mobile terminal may include a wireless communication circuit for supporting various types of communication. For example, the wireless communication circuit may include a radio frequency (RF) component such as a power amplifier (PA) for amplifying a signal to be transmitted.

The mobile terminal may supply power to RF front-end (RFFE) components (e.g., a PA) using the PMIC. For example, the PMIC may supply a driving voltage (Vcc) to the PA of the RFFE. The PA may amplify and output an input signal based on the driving voltage Vcc.

During communication of the mobile terminal, the PA may consume a lot of power. The PMIC may operate in an envelope tracking (ET) mode or an average power tracking (APT) mode so as to efficiently manage power consumed by the PA.

A magnitude of the driving voltage that is required for the PA included in the transmission path of the RFFE may be different depending on a strength of the wireless signal transmitted by the mobile terminal. For example, the driving voltage supplied to the PA may be changed depending on the situation (e.g., a channel state or communication quality) of the electronic device.

The PMIC may determine the magnitude of the driving voltage based on the operation mode. The driving voltage that the PMIC intends to supply to the PA may be referred to as a target voltage.

The capacitor connected to an output terminal of the PMIC may be charged or discharged depending on the magnitude of the target voltage. Due to the charging and discharging in the capacitor, a physical vibration of the capacitor may occur. Noise in the audible frequency band may occur due to the vibration of the capacitor.

In addition, a certain amount of time may be required for the capacitor to be charged or discharged to a target voltage. As the capacitance of the capacitor increases, a transition time to the target voltage may increase. As the transition time increases, a delay time until transmitting a signal of a specified strength may increase.

SUMMARY

The present disclosure has been made to address the above-mentioned problems and disadvantages, and to provide at least the advantages described below.

According to an aspect of the disclosure, an electronic device includes a battery, a plurality of capacitors, a converter that receives power from the battery and charges each of the plurality of capacitors to different voltages based on the power, a plurality of switches that switch a first path and a second path of each of the plurality of capacitors, and a controller operatively coupled to the battery, the plurality of capacitors, and the plurality of switches. The controller selects a first switch among the plurality of switches based on a received signal, and controls the first switch such that a path of a capacitor connected to the first switch is switched from the first path to the second path. The first path is a path which electrically connects each of the plurality of capacitors to the converter, and the second path is a path which electrically connects each of the plurality of capacitors and a PA.

According to an another aspect of the disclosure, an operating method of an electronic device includes selecting a first switch among a plurality of switches based on a received signal, and switching a path of a capacitor connected to the first switch among a plurality of capacitors from a first path to a second path. Each of the plurality of capacitors is charged with a different voltage in the first path, and the second path is a path which electrically connects each of the plurality of capacitors to the PA.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
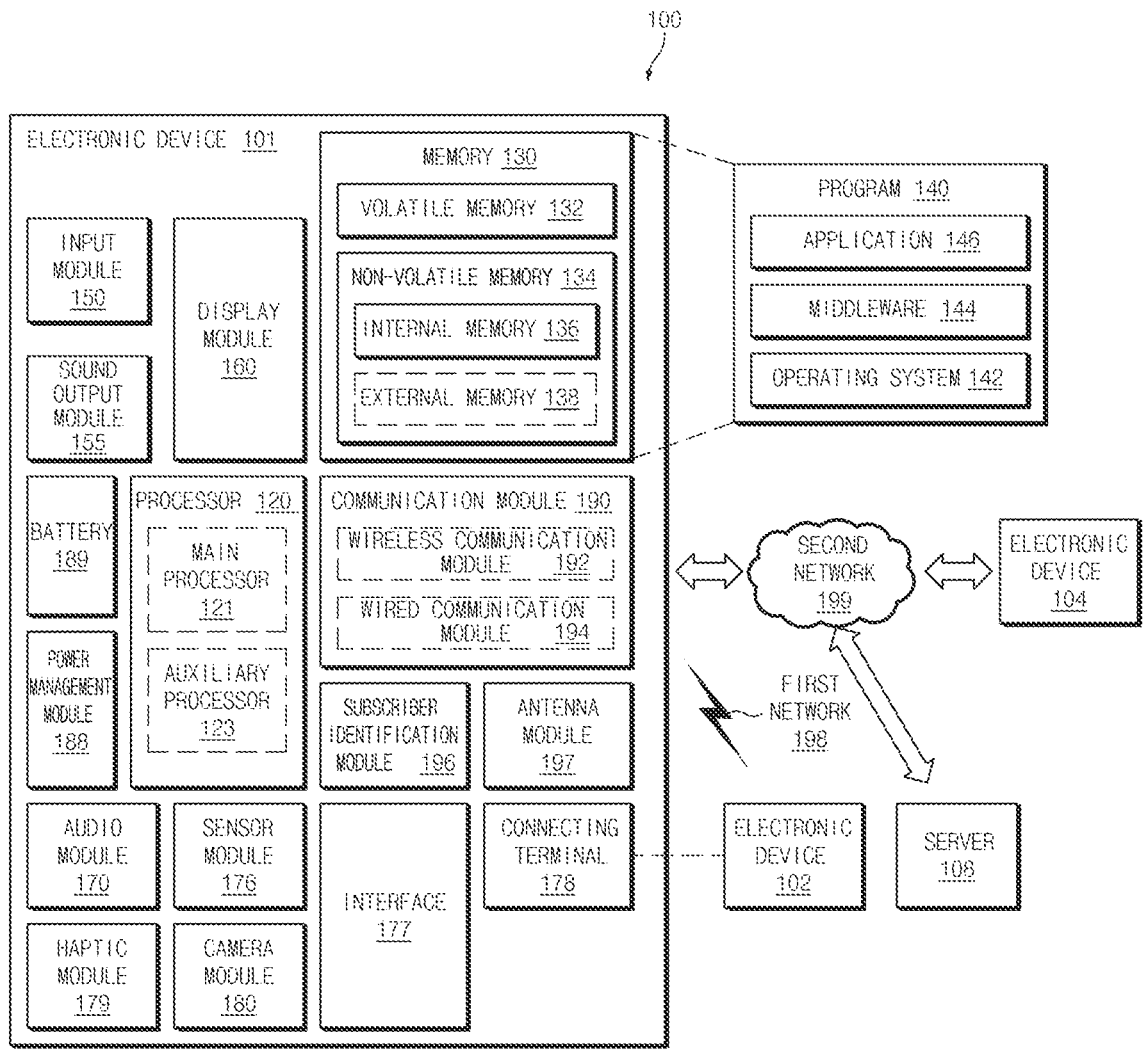
FIG. 1 illustrates an electronic device in a network environment, according to an embodiment.

Various embodiments of the present disclosure are described with reference to the accompanying drawings. However, various embodiments of the present disclosure are not limited to particular embodiments, and it should be understood that modifications, equivalents, and/or alternatives of the embodiments described herein can be variously made. With regard to description of drawings, similar components may be marked by similar reference numerals.

According to the embodiments disclosed in this document, an electronic device and method capable of reducing noise and transition time are provided.

According to embodiments disclosed in this document, an electronic device may reduce noise and transition time by limiting the amount of charging or discharging of the capacitor.

Besides, a variety of effects directly or indirectly understood through this disclosure may be provided.

The effects that are achieved through various embodiments of the disclosure may not be limited to what has been particularly described herein, and other advantages not described herein may be more clearly understood from the following detailed description by persons skilled in the art.

FIG. 1 illustrates an electronic device in a network environment according to an embodiment.

Referring to FIG. 1, an electronic device 101 in a network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an ISP or a CP) may be implemented as part of another component (e.g., the camera module 180 or the communication module 190) functionally related to the auxiliary processor 123. According to an embodiment, the auxiliary processor 123 (e.g., the NPU) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent DNN (BRDNN), deep Q-network, or a combination of two or more thereof, but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, ISPs, or flashes.

The power management module 188 may manage power supplied to the electronic device 101. According to one embodiment, the power management module 188 may be implemented as at least part of, for example, a PMIC.

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more CPs that are operable independently from the processor 120 (e.g., the AP) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5th generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network, after a 4th generation (4G) network, and next-generation communication technology, e.g., NR access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., an RF integrated circuit (RFIC)) other than the radiating element may be additionally formed as part of the antenna module 197.

According to various embodiments, the antenna module 197 may form a mmWave antenna module. According to an embodiment, the mmWave antenna module may include a PCB, a RFIC disposed on a first surface (e.g., the bottom surface) of the PCB, or adjacent to the first surface and capable of supporting a designated high-frequency band (e.g., the mmWave band), and a plurality of antennas (e.g., array antennas) disposed on a second surface (e.g., the top or a side surface) of the PCB, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or MEC. In another embodiment, the external electronic device 104 may include an Internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a mobile communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
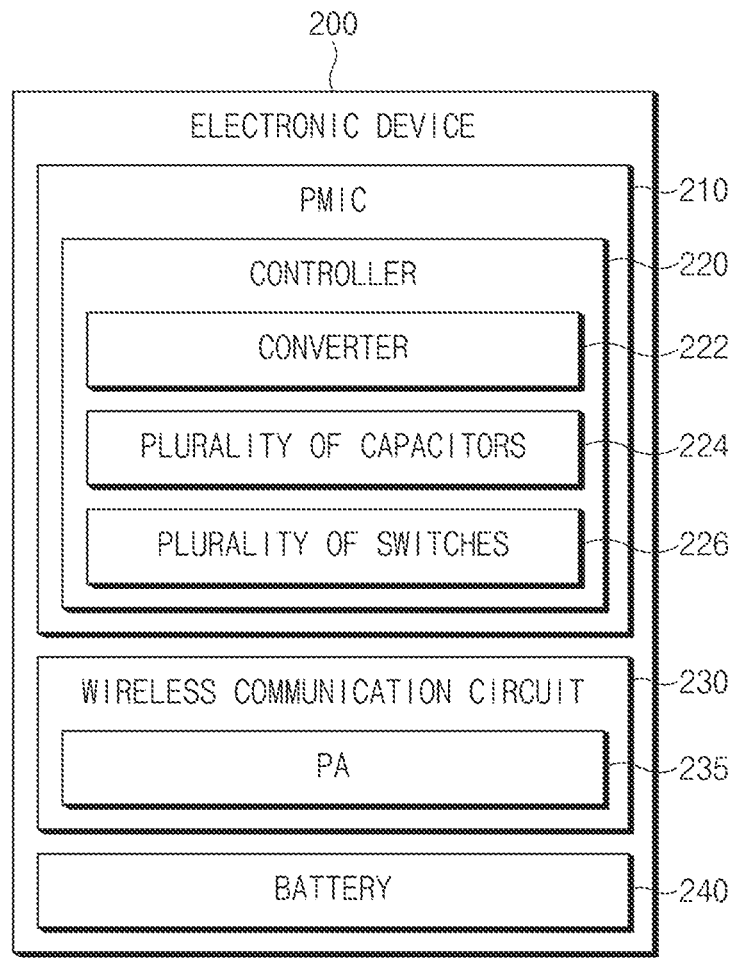
FIG. 2 illustrates an electronic device, according to an embodiment.

FIG. 2 illustrates an electronic device, according to an embodiment.

Referring to FIG. 2, an electronic device 200 includes a PMIC 210, a wireless communication circuit 230, and/or a battery 240.

The PMIC 210 and the battery 240 may correspond to the power management module 188 and the battery 189 of FIG. 1, respectively.

The PMIC 210 may include a controller 220. The PMIC 210 may further include other components such as at least one regulator. The at least one regulator may include a boost converter, a buck converter, and/or a linear regulator. The PMIC 210 may further include a plurality of inductors.

The controller 220 may be operatively connected to other components of the PMIC 210, the wireless communication circuit 230, and/or the battery 240. The controller 220 may be operatively connected to a PA 235 of the wireless communication circuit 230.

The controller 220 includes a converter 222, a plurality of capacitors 224, and/or a plurality of switches 226.

The converter 222 may convert the power supplied from the battery 240 into a specified voltage. For example, the converter 222 may be a direct current (DC)/DC converter that converts a DC voltage into a DC voltage.

The plurality of switches 226 may connect the plurality of capacitors 224 to a first path or a second path. The first path may be a path electrically connected to the converter 222. The second path may be a path electrically connected to the PA of the wireless communication circuit 230.

The plurality of capacitors 224 may be connected to the first path or the second path by the plurality of switches 226. The plurality of capacitors 224 may be charged to a voltage specified by the converter 222 in the first path. The plurality of capacitors 224 may be charged or discharged depending on the magnitude of a target voltage in the second path. The target voltage may be a driving voltage of the PA determined based on an operation mode of the PMIC 210.

The wireless communication circuit 230 may support wireless communication based on various communication protocols (e.g., an LTE communication and a NR communication). The wireless communication circuit 230 may include the PA 235. The PA 235 may amplify and output the intensity of the input signal based on the magnitude of the driving voltage Vcc. The magnitude of the driving voltage may be determined based on the operation mode of the PMIC 210.

Figure 3:
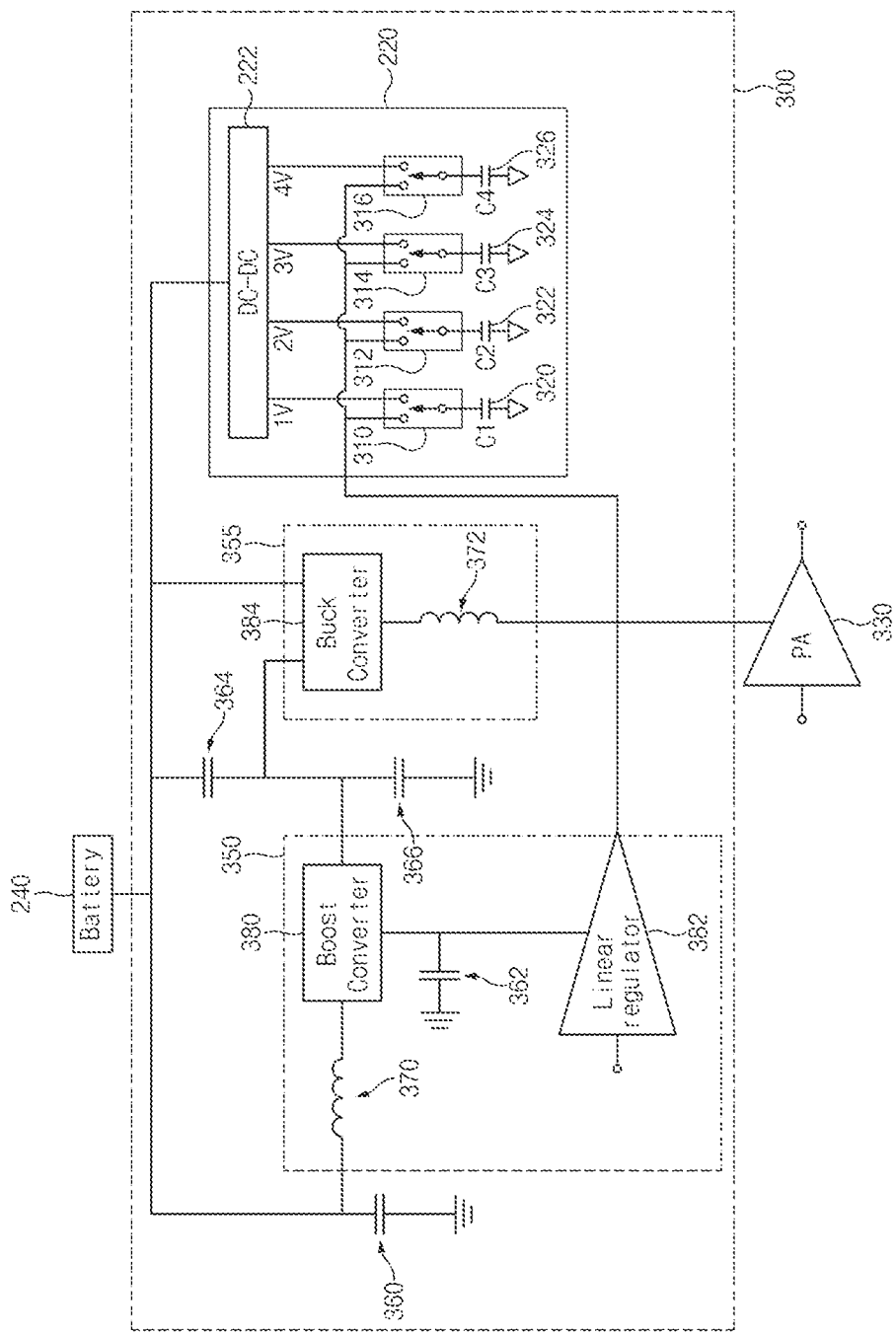
FIG. 3 illustrates a part of a PMIC configuration, according to an embodiment.

FIG. 3 illustrates a part of a PMIC configuration, according to an embodiment.

Referring to FIG. 3, a block 300 may correspond to at least a part of the configuration of the PMIC 210. According to the block 300, the PMIC 210 may include the controller 220, at least one regulator 380, 382, or 384, at least one circuit element (e.g., a plurality of capacitors 360, 362, 364, and 366), and/or a plurality of inductors 370 and 372. The PMIC 210 may further include other and/or additional components (e.g., a capacitor, an inductor, a class AB amplifier).

The at least one regulator 380, 382, or 384 may efficiently convert a voltage to supply voltages of various magnitudes to components of the electronic device 200. For example, at least one of the regulators 380, 382, and 384 may output an input DC voltage as a stabilized DC voltage or may linearly adjust a linear envelope signal.

The at least one regulator 380, 382, or 384 may include the boost converter 380, the buck converter 384, and/or the linear regulator 382. The boost converter 380 and the buck converter 384 may be a type of switching regulator. The switching regulator may generate an output voltage at high speed by using on/off of the switching element. The switching regulator may boost or drop the input voltage with high efficiency and low heat generation. The boost converter 380 may boost the input voltage and may output it. The buck converter 384 may drop the input voltage to output it.

The linear regulator 382 may adjust a gain of the output voltage using a variable resistor. The linear regulator 382 may amplify and output the input voltage by a specified gain. The linear regulator 382 may linearly output a broadband envelope signal.

The PMIC 210 may include a linear stage 350 and a switching stage 355.

The linear stage 350 may include the boost converter 380, the linear regulator 382, the at least one capacitor 362, and/or the at least one inductor 370. The linear stage 350 may be activated or deactivated based on the operation mode of the PMIC 210. The linear stage 350 may be deactivated in the idle mode or the APT mode of the PMIC 210. The linear stage 350 may be activated in the ET mode of the PMIC 210.

The linear stage 350 may linearly amplify the voltage input in the ET mode of the PMIC 210 depending on the envelope signal. The linear stage 350 may supply voltage and current to the PA 235. The at least one capacitor 362 may uniformly maintain the level of the output voltage of the linear stage 350.

The switching stage 355 may include the buck converter 384 and/or the at least one inductor 372. The switching stage 355 may be activated or deactivated based on the operating mode of the PMIC 210. For example, the switching stage 355 may be deactivated in the idle mode of the PMIC 210. The switching stage 355 may be activated in the ET mode or the APT mode of the PMIC 210.

The switching stage 355 may convert the input voltage with high efficiency in the ET mode or the APT mode of the PMIC 210. The switching stage 355 may supply a high-efficiency current to the PA 235. The at least one inductor 372 may instantaneously pass or block a current to the switching stage 355.

The controller 220 may include the converter 222, a plurality of capacitors 320, 322, 324, and 326, and/or a plurality of switches 310, 312, 314, and 316. Each of the plurality of switches 310, 312, 314, and 316 may correspond to each of the plurality of capacitors 320, 322, 324, and 326.

The controller 220 may be electrically connected to the battery 240. The controller 220 may be electrically connected to the PA 235.

The controller 220 may connect each of the corresponding plurality of capacitors 320, 322, 324, and 326 to the first path or the second path using the plurality of switches 310, 312, 314, and 316.

The controller 220 may charge the plurality of capacitors 320, 322, 324, and 326 to different voltages, based on the power supplied from the battery 240 in the first path. In this case, the plurality of switches 310, 312, 314, and 316 may connect the plurality of capacitors 320, 322, 324, and 326 to the first path. In the first path, the capacitor 320 may be charged to 1 V, the capacitor 322 may be charged to 2 V, the capacitor 324 may be charged to 3 V, and the capacitor 326 may be charged to 4 V. The charging voltages of the plurality of capacitors 320, 322, 324, and 326 may be set to different voltage values from those of FIG. 3.

The controller 220 may electrically connect at least one of the plurality of capacitors 320, 322, 324, and 326 to the PA 235 in the second path. In this case, the plurality of switches 310, 312, 314, and 316 may connect at least one of the plurality of capacitors 320, 322, 324, and 326 to the second path. At least one of the plurality of capacitors 320, 322, 324, and 326 may be charged or discharged to the target voltage in the second path.

Hereinafter, an operation of the controller 220 based on the operation mode of the PMIC 210 will be described.

The PMIC 210 may operate in one of the idle mode, the ET mode, or the APT mode based on the operation of the electronic device 200.

The PMIC 210 may operate in a sleep mode in response to the electronic device 200 entering the sleep mode. For example, the sleep mode of the electronic device 200 may be a mode in which a communication related function is stopped to save the battery and operates in a low power state. The PMIC 210 may cut off power supply to internal components of the PMIC 210 in the sleep mode. Due to this, all outputs of the PMIC 210 may be maintained in a tri-stated state. The output of the PMIC 210 may have a high-impedance (Hi-Z) state in addition to "0" and "1" in the tri-stated state.

The PMIC 210 may receive the envelope signal from the wireless communication circuit 230 when transmitting a wireless signal in the ET mode. The wireless communication circuit 230 may acquire the envelope signal based on peak values of the transmission signal. The PMIC 210 may determine a driving voltage (or a target voltage) to be supplied to the PA based on the received envelope signal.

When transmitting the wireless signal in the APT mode, the PMIC 210 may determine an average power based on an average of peak values of the transmission signal. The PMIC 210 may determine the driving voltage (or the target voltage) to be supplied to the PA based on the average power.

The PMIC 210 may transmit a signal to the controller 220 based on the operation mode of the PMIC 210. The signal may include information on the operation mode of the PMIC 210 and information on the target voltage. The controller 220 may control the plurality of switches 226 based on the received signal. The controller 220 may control the plurality of switches 226 such that at least one of the plurality of capacitors 224 is connected to the second path. At least one of the plurality of capacitors 224 may be charged or discharged to the target voltage in the second path.

Figure 4:
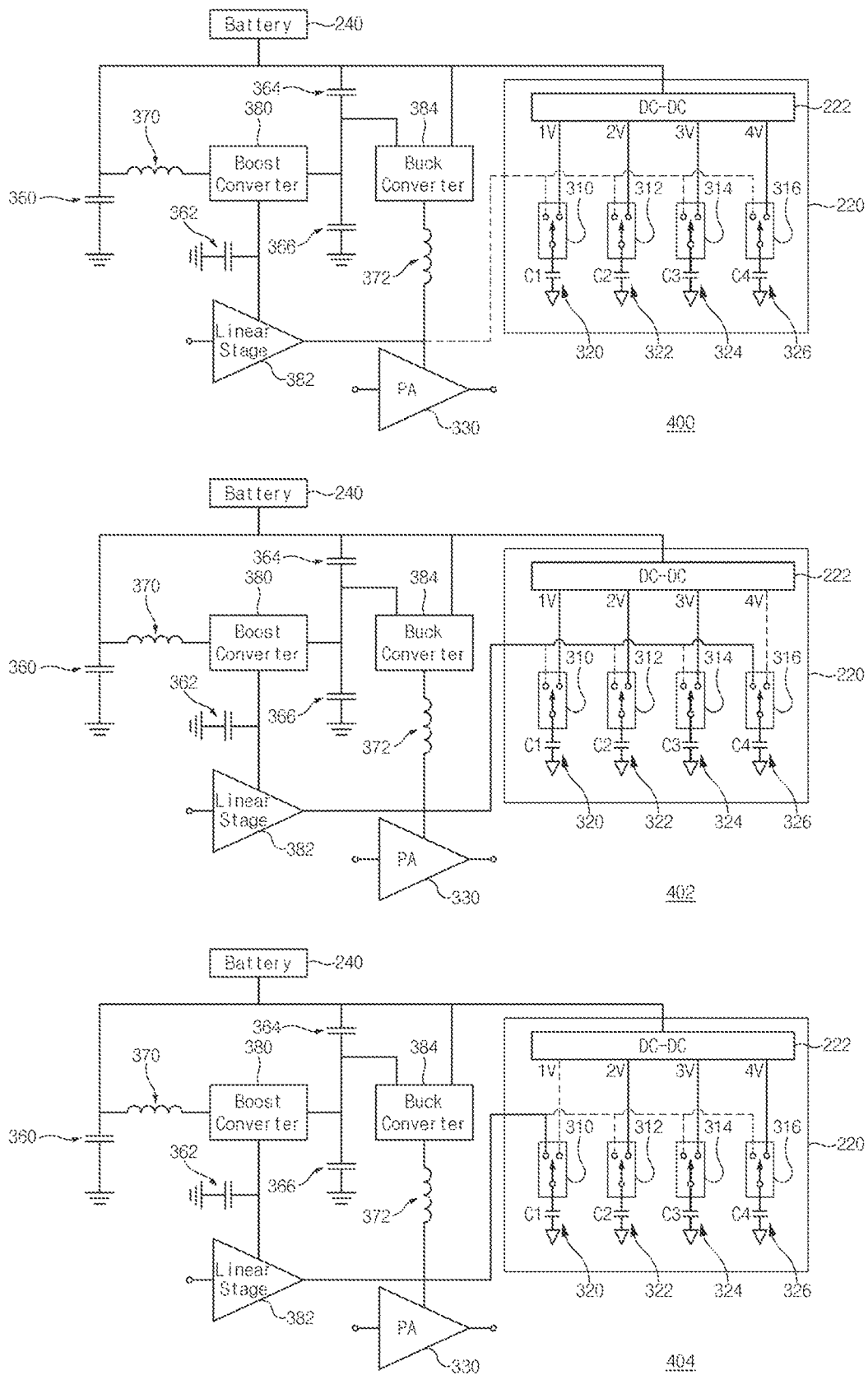
FIG. 4 illustrates an operation of a controller depending on a received signal, according to an embodiment.

FIG. 4 illustrates an operation of a controller depending on a received signal, according to an embodiment.

Referring to FIG. 4, the controller 220 may identify the operation mode of the PMIC 210 based on the received signal. Reference numeral 400 illustrates a case in which the PMIC 210 is in an idle mode or an ET mode. Reference numerals 402 or 404 illustrates cases in which the PMIC 210 is in the APT mode.

At reference numeral 400, the controller 220 may connect the plurality of capacitors 320, 322, 324, and 326 to the first path. The plurality of capacitors 320, 322, 324, and 326 may be charged with different voltages specified by the converter 222.

Reference numeral 400 indicates that the linear stage 382 and the switching stage 355 are activated, and the plurality of capacitors 320, 322, 324, and 326 may be connected to the first path.

At reference numeral 402 or 404, the controller 220 may identify the magnitude of the target voltage based on the received signal. The controller 220 may control the plurality of switches 310, 312, 314, and 316 such that at least one of the plurality of capacitors 320, 322, 324, and 326 is connected to the second path, based on the magnitude of the target voltage.

Referring to reference numeral 402, when the target voltage is 3.6 V, the controller 220 may connect the capacitor 326 charged with the voltage closest to the target voltage (e.g., 4 V) to the second path. The capacitor 326 may be discharged to the magnitude of the target voltage in the second path.

Referring to reference numeral 404, when the target voltage is 1.2 V, the controller 220 may connect the capacitor 320 charged with the voltage closest to the target voltage (e.g., 1 V) to the second path. The capacitor 320 may be charged to the level of the target voltage in the second path.

At reference numeral 402 and/or 404, the linear stage 350 may be deactivated, and the switching stage 355 may be activated. In addition, at least one of the plurality of capacitors 320, 322, 324, and 326 may be charged or discharged in the second path by the controller 220.

When the PMIC 210 operating in the APT mode is switched to the idle mode or the ET mode based on the received signal, the controller 220 may connect at least one of the plurality of capacitors 320, 322, 324, and 326 connected with the second path back to the first path.

The electronic device 200 may include the battery 240, the plurality of capacitors 224, the converter 222 that receives power from the battery 240 and charges each of the plurality of capacitors 224 to different voltages based on the power, the plurality of switches 226 that switch a first path and a second path of each of the plurality of capacitors 224, the controller 220 operatively coupled to the battery 240, and the plurality of capacitors 224. The controller 220 may select a first switch among the plurality of switches 226 based on the received signal, and may control the first switch such that a path of the capacitor connected to the first switch is switched from the first path to the second path. The first path may be a path which electrically connects each of the plurality of capacitors 224 to the converter, and the second path may be a path which is electrically connected with each of the plurality of capacitors 224 and a PA 330.

The received signal may include information on a target voltage, and the controller 220 may identify a first capacitor charged to a first voltage closest to the target voltage among the different voltages, and may select a switch corresponding to the first capacitor among the plurality of switches 226 as the first switch, and the target voltage may be applied as a driving voltage of the PA 330.

The controller 220 may select a second switch from among the plurality of switches 226 other than the first switch based on the received signal, may control the first switch such that a path of the capacitor connected to the first switch is switched from the second path to the first path, and may control the second switch such that a path of the capacitor connected to the second switch is switched from the first path to the second path.

The electronic device 200 may further include the PMIC 210 operatively connected to the controller 220, and the received signal may include information related to an operation mode of the PMIC. The operation mode may include at least one of an idle mode, an ET mode, or an APT mode.

The controller 220 may control the plurality of switches 226 such that the plurality of capacitors 224 are connected to the first path in response to the operation mode being the idle mode or the ET mode. The controller 220 may select the first switch in response to the operation mode being the APT mode.

The PMIC 210 may include the linear stage 350 including the boost converter 380 and at least one capacitor connected to an output terminal of the boost converter 380, and the linear stage 350 may be activated in response to the operation mode being the ET mode. The PMIC 210 may further include the switching stage 355 including the buck converter 384, and the switching stage 355 may be activated in response to the operation mode being the APT mode. An output terminal of the linear stage 350 and an output terminal of the switching stage 355 may be electrically connected to the PA 330.

The PMIC 210 may include a class AB buffer 710, and an output terminal of the class AB buffer 710 may be electrically connected to the PA 330.

Figure 5:
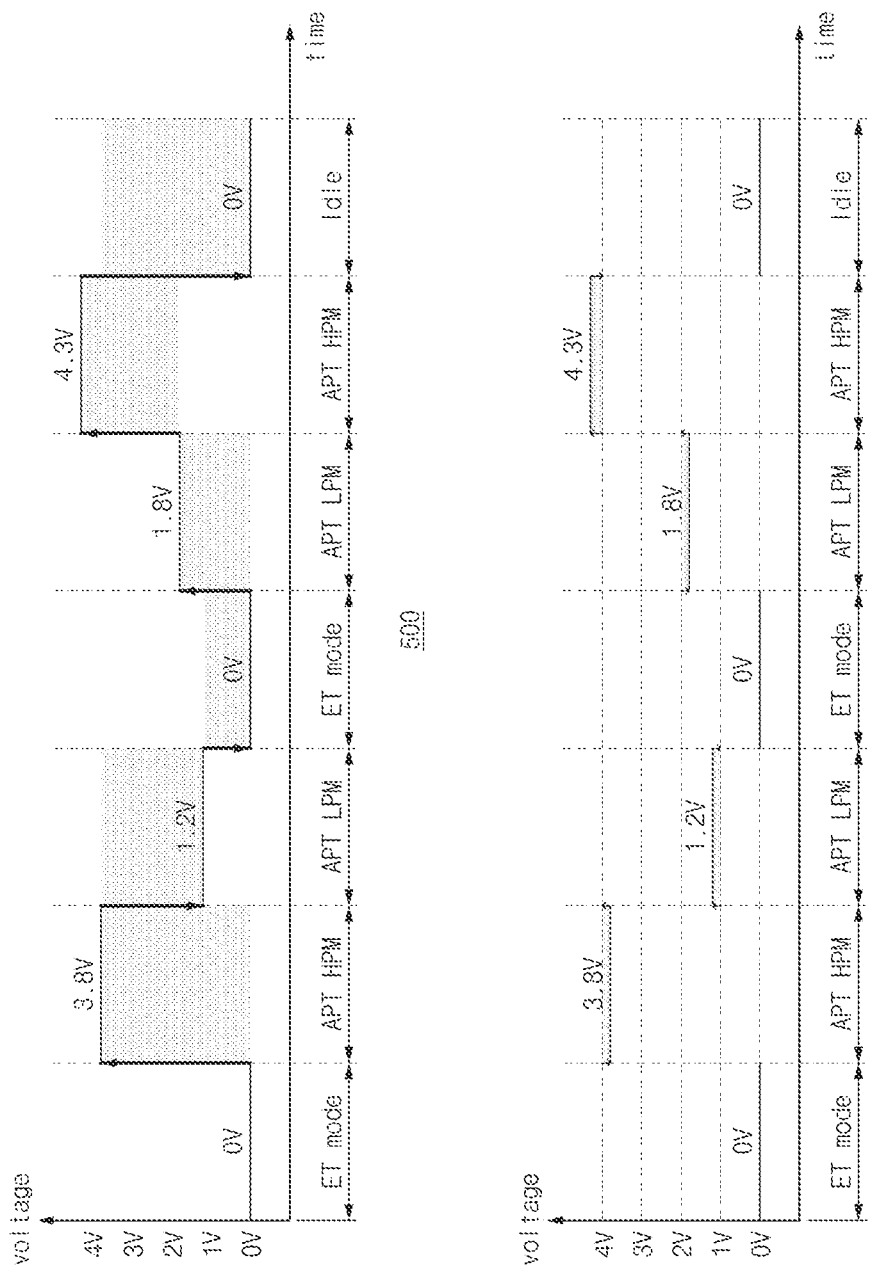
FIG. 5 illustrates charging or discharging of a capacitor, according to an embodiment.

FIG. 5 illustrates charging or discharging of a capacitor, according to an embodiment. For the description of FIG. 5, the configurations of FIGS. 2 to 4 may be referred to.

A graph 500 illustrates charging and discharging when the controller 220 is replaced with one capacitor, which is different than FIG. 3. Since the capacitor according to the graph 500 has a large amount of charging or discharging, the capacitor may have a relatively high capacity compared to the plurality of capacitors 224 of FIG. 3.

Referring to the graph 500, one capacitor may be repeatedly charged or discharged based on the magnitude of the target voltage. In this case, noise in an audible frequency band may occur due to the vibration of the capacitor. In addition, since the capacitor has a large capacity, a long transition time may be required.

A graph 505 illustrates charging and discharging of the plurality of capacitors 224 included in the controller 220 of FIG. 3. The capacitor to be charged or discharged in the graph 505 may be a part of the plurality of capacitors 224.

Referring to the graph 505, at least one of the plurality of capacitors 224 close to the target voltage may be charged or discharged. In the graph 505, since the amount of charging or discharging of the capacitor is very small compared to the graph 500, noise due to vibration of the capacitor may also be reduced. In addition, since the plurality of capacitors 224 have relatively small capacitances, a short transition time may be required. The electronic device 200 may perform symbol power tracking in NR communication based on the short transition time.

Figure 6:
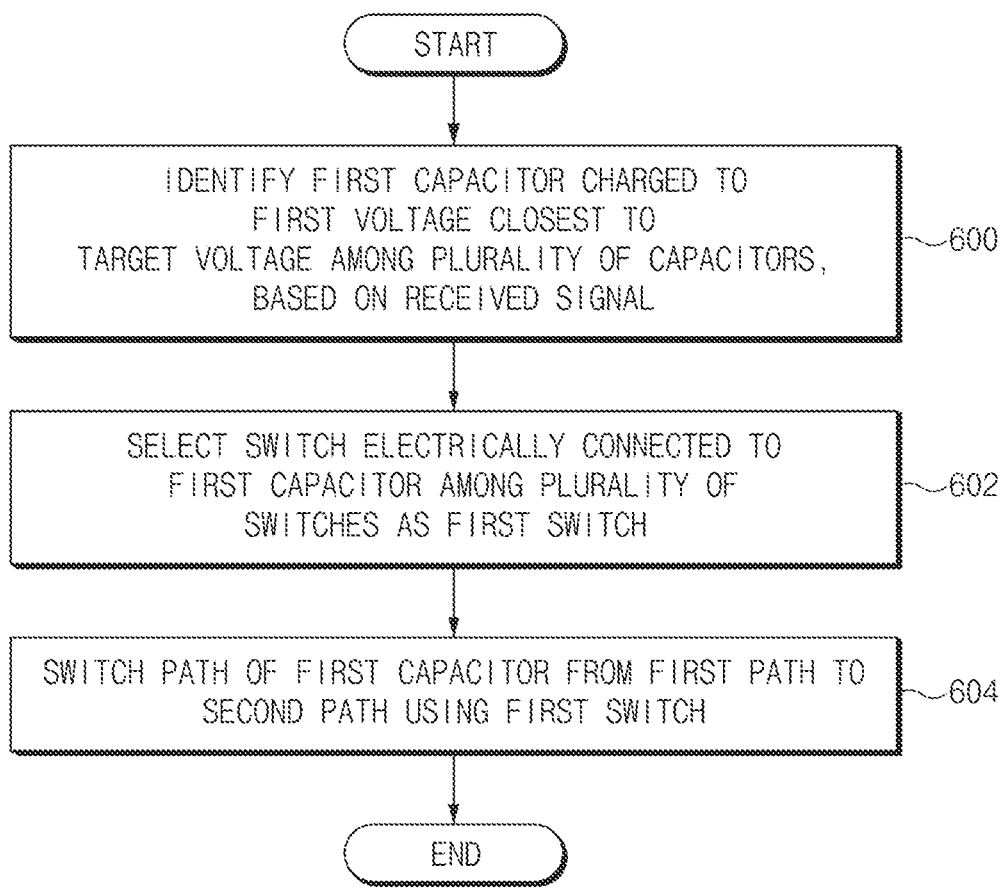
FIG. 6 is a flowchart describing an operation of an electronic device, according to an embodiment.

FIG. 6 is a flowchart describing an operation of an electronic device, according to an embodiment. For the description of FIG. 6, the configurations of FIGS. 2 to 4 may be referred to.

In step 600, the controller 220 identifies a first capacitor charged to a first voltage closest to the target voltage among the plurality of capacitors 224, based on the received signal. The first capacitor may be connected to the first path. In the first path, the first capacitor may be connected to the converter 222 to be charged to the first voltage. For example, the received signal may include information on the operation mode and the target voltage of the PMIC 210. The target voltage may be a voltage to be supplied to the PA 235 as a driving voltage.

In step 602, the controller 220 selects a switch electrically connected to the first capacitor among the plurality of switches 226 as the first switch.

In step 604, the controller 220 may switch the path of the first capacitor from the first path to the second path using the first switch. In the second path, the first capacitor may be electrically connected to the PA 235 of the wireless communication circuit 230. The first capacitor may be charged or discharged to the target voltage in the second path.

Figure 7:
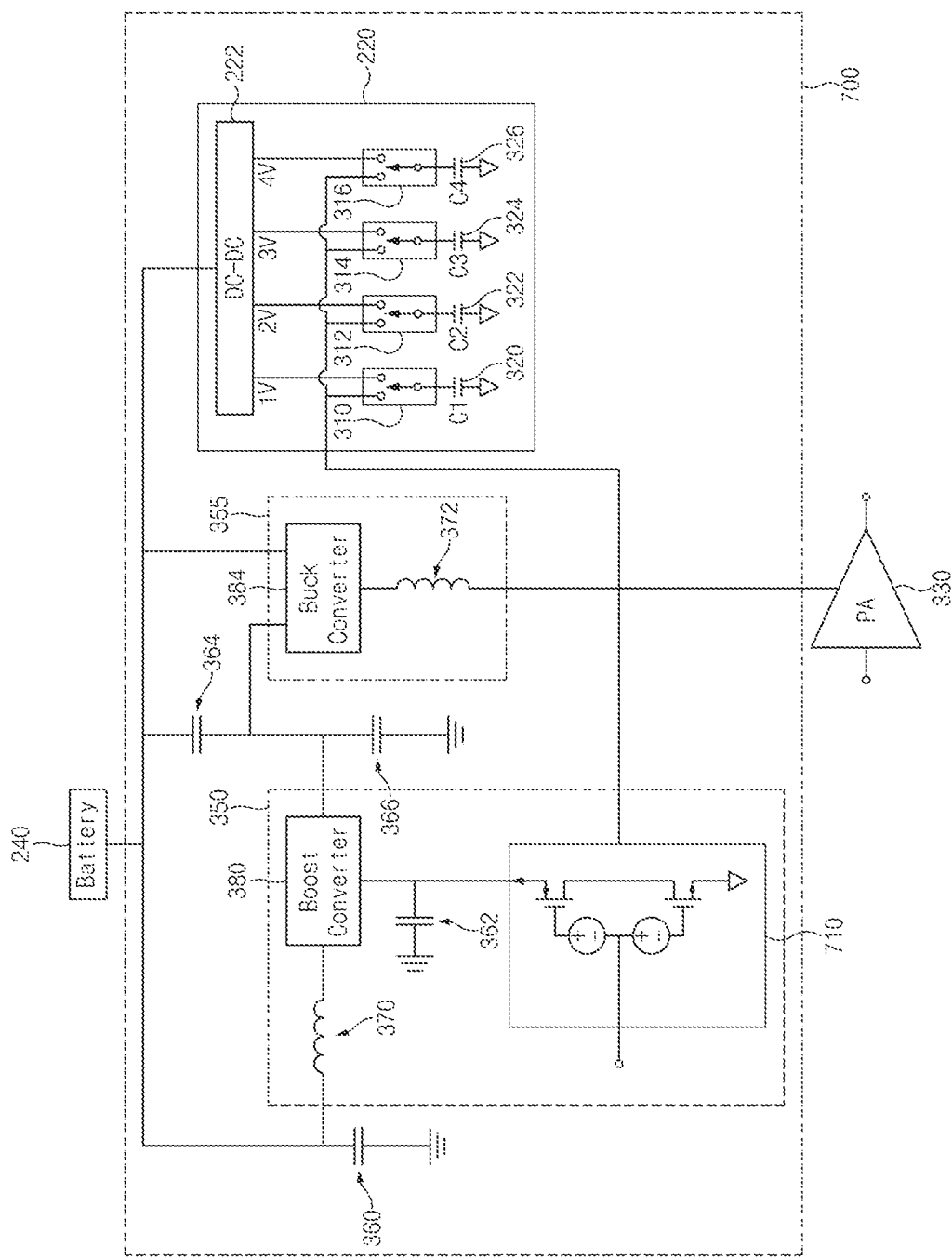
FIG. 7 illustrates an electronic device including a class AB buffer, according to an embodiment.

FIG. 7 illustrates an electronic device including a class AB buffer, according to an embodiment. For the description of FIG. 7, the configurations of FIGS. 2 to 4 may be referred to.

A block 700 may correspond to at least a part of the configuration of the PMIC 210. In block 700, which is different than block 300 of FIG. 3, the linear regulator 382 of the linear stage 350 may be replaced with the class AB buffer 710. The class AB buffer 710 may control a quiescent current using a feedback circuit.

In contrast to that described above in FIG. 3, in FIG. 7, the linear stage 350 and the switching stage 355 may be activated in the APT mode of the PMIC 210. In the APT mode of the PMIC 210, the class AB buffer 710 of the linear stage 350 may support charging or discharging of the capacitor (e.g., at least one of the plurality of capacitors 224) connected to the second path. For example, the class AB buffer 710 may increase the charging or discharging rate of the capacitor through the feedback operation. Accordingly, the transition time to the target voltage may be reduced.

While the present disclosure has been particularly shown and described with reference to certain embodiments thereof, it will be understood by those of ordinary skill in the art that various changes in form and details may be made therein without departing from the spirit and scope of the disclosure as defined by the appended claims and their equivalents.

What is claimed is:

1. An electronic device, comprising:
a battery;
a plurality of capacitors;
a converter configured to receive power from the battery and to charge each of the plurality of capacitors to different voltages based on the power;
a plurality of switches configured to switch a first path and a second path of each of the plurality of capacitors; and
a controller operatively coupled to the battery, the plurality of capacitors, and the plurality of switches,
wherein the controller selects a first switch among the plurality of switches based on a received signal and controls the first switch such that a path of a capacitor connected to the first switch is switched from the first path to the second path,
wherein the first path is a path which electrically connects each of the plurality of capacitors to the converter, and
wherein the second path is a path which electrically connects each of the plurality of capacitors and a power amplifier (PA).

2. The electronic device of claim 1, wherein the received signal includes information on a target voltage,
wherein the controller identifies a first capacitor charged to a first voltage closest to the target voltage among the different voltages, and selects a switch corresponding to the first capacitor among the plurality of switches as the first switch, and
wherein the target voltage is applied as a driving voltage of the PA.

3. The electronic device of claim 1, wherein the controller selects a second switch from among the plurality of switches other than the first switch based on the received signal, controls the first switch such that a path of the capacitor connected to the first switch is switched from the second path to the first path, and controls the second switch such that a path of a capacitor connected to the second switch is switched from the first path to the second path.

4. The electronic device of claim 1, further comprising a power management integrated circuit (PMIC) operatively connected to the controller,
wherein the received signal includes information related to an operation mode of the PMIC, and
wherein the operation mode includes at least one of an idle mode, an envelope tracking (ET) mode, or an average power tracking (APT) mode.

5. The electronic device of claim 4, wherein the controller controls the plurality of switches such that the plurality of capacitors are connected to the first path in response to the operation mode being the idle mode or the ET mode.

6. The electronic device of claim 4, wherein the controller selects the first switch in response to the operation mode being the APT mode.

7. The electronic device of claim 4, wherein the PMIC includes a linear stage including a boost converter and at least one capacitor connected to an output terminal of the boost converter, and
wherein the linear stage is activated in response to the operation mode being the ET mode.

8. The electronic device of claim 7, wherein the PMIC further includes a switching stage including a buck converter, and
wherein the switching stage is activated in response to the operation mode being the APT mode.

9. The electronic device of claim 8, wherein an output terminal of the linear stage and an output terminal of the switching stage are electrically connected to the PA.

10. The electronic device of claim 4, wherein the PMIC includes a class AB buffer, and
wherein an output terminal of the class AB buffer is electrically connected to the PA.

11. A method of operating an electronic device, the method comprising:
selecting a first switch among a plurality of switches based on a received signal; and
switching a path of a capacitor connected to the first switch among a plurality of capacitors from a first path to a second path,
wherein each of the plurality of capacitors is charged with a different voltage in the first path, and
wherein the second path is a path which electrically connects each of the plurality of capacitors to a power amplifier (PA).

12. The method of claim 11, wherein the received signal includes information on a target voltage, and
wherein selecting the first switch includes:
identifying a first capacitor charged to a first voltage closest to the target voltage among the different voltages, and
selecting a switch corresponding to the first capacitor among the plurality of switches as the first switch,
wherein the target voltage is applied as a driving voltage of the PA.

13. The method of claim 11, further comprising:
selecting a second switch from among the plurality of switches other than the first switch based on the received signal;
switching the path of the capacitor connected to the first switch from the second path to the first path; and
switching a path of a capacitor connected to the second switch from the first path to the second path.

14. The method of claim 11, wherein the received signal includes information related to an operation mode of a power management integrated circuit (PMIC), and
wherein the operation mode includes at least one of an idle mode, an envelope tracking (ET) mode, or an average power tracking (APT) mode.

15. The method of claim 14, further comprising:
connecting the plurality of capacitors to the first path in response to the operation mode being the idle mode or the ET mode.

16. The method of claim 14, further comprising selecting the first switch in response to the operation mode being the APT mode.

17. The method of claim 14, wherein the PMIC includes a linear stage including a boost converter and at least one capacitor connected to an output terminal of the boost converter, and
wherein the linear stage is activated in response to the operation mode being the ET mode.

18. The method of claim 17, wherein the PMIC further includes a switching stage including a buck converter, and
wherein the switching stage is activated in response to the operation mode being the APT mode.

19. The method of claim 18, wherein an output terminal of the linear stage and an output terminal of the switching stage are electrically connected to the PA.

20. The method of claim 14, wherein the PMIC includes a class AB buffer, and
wherein an output terminal of the class AB buffer is electrically connected to the PA.

* * * * *